United States Patent
Chen

(10) Patent No.: US 7,812,671 B2
(45) Date of Patent: Oct. 12, 2010

(54) TRANSFORMER AND STRUCTURE THEREOF AND POWER AMPLIFIER

(75) Inventor: Cheng-Chung Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 65 days.

(21) Appl. No.: 12/274,288

(22) Filed: Nov. 19, 2008

(65) Prior Publication Data

US 2010/0052782 A1  Mar. 4, 2010

(30) Foreign Application Priority Data

Aug. 28, 2008  (TW)  .............................. 97132997 A

(51) Int. Cl.
*H03F 3/45*  (2006.01)
(52) U.S. Cl. ...................... 330/252; 330/195
(58) Field of Classification Search ................ 330/165, 330/195, 252, 171, 197; 333/177
See application file for complete search history.

(56) References Cited

U.S. PATENT DOCUMENTS

| | | | |
|---|---|---|---|
| 6,737,948 B2 | 5/2004 | Aoki et al. | |
| 6,856,199 B2 | 2/2005 | Komijani et al. | |
| 7,095,283 B2 | 8/2006 | Kee et al. | |
| 7,365,602 B2 | 4/2008 | Bhatti et al. | |
| 7,372,336 B2 | 5/2008 | Lee et al. | |
| 7,397,305 B2 * | 7/2008 | Kim et al. | ................... 330/146 |

* cited by examiner

*Primary Examiner*—Steven J Mottola
(74) *Attorney, Agent, or Firm*—Jianq Chyun IP Office

(57) ABSTRACT

A transformer and a structure thereof and a power amplifier are provided. The transformer includes a first inductor to a fourth inductor, a first capacitor, and a second capacitor. A first terminal of the first inductor receives a first signal. A first terminal of the second inductor is coupled to the first terminal of the first inductor. A first terminal of the third inductor receives a second signal, and a second terminal of the third inductor is coupled to a second terminal of the first inductor. A first terminal of the fourth inductor is coupled to the first terminal of the third inductor. The first capacitor is coupled between the first terminal of the first inductor and the first terminal of the third inductor. The second capacitor is coupled between a second terminal of the second inductor and a second terminal of the forth inductor.

28 Claims, 3 Drawing Sheets

TRANSFORMER AND STRUCTURE THEREOF AND POWER AMPLIFIER

CROSS-REFERENCE TO RELATED APPLICATION

This application claims the priority benefit of Taiwan application serial no. 97132997, filed on Aug. 28, 2008. The entirety of the above-mentioned patent application is hereby incorporated by reference herein and made a part of this specification.

BACKGROUND OF THE INVENTION

1. Field of the Invention

The present invention relates to a radio frequency transformer. More particularly, the present invention relates to a single wire-wound transformer.

2. Description of Related Art

A transformer can transmit energy from one circuit to another circuit via electromagnetic coupling, and main usages thereof are to transform a voltage, change impedance and divide a circuit. During power transmission, the transformer plays an important role. Therefore, the transformer is widely applied to various electronic devices and circuits. In a radio frequency circuit, the transformer is generally used for impedance matching between differential circuits. In the following content, the conventional transformer is described in detail.

In a conventional technique, the transformer is consisted of two separated and corresponding sets of inductor and capacitor, and the two inductors respectively connect different circuits. When uncertain amounts of current pass through a first coil, varied magnetic field is generated. According to an electromagnetic mutual inductance theory, a potential difference is generated on a second coil due to the varied magnetic field. The capacitor is used for generating a resonance with the coil inductor under an operation frequency of, so as to achieve a maximum energy transfer.

It should be noted that the conventional transformer technique applying two inductors for mutual inductance may have rather high energy dissipation for radio frequency band, and the dissipation relates to characteristics of the inductors.

SUMMARY OF THE INVENTION

The present invention is directed to a transformer and a structure thereof having improved efficiencies.

The present invention is directed to a power amplifier having improved efficiency.

The present invention provides a transformer including a first inductor to a fourth inductor, a first capacitor, and a second capacitor. A first terminal of the first inductor receives a first signal. A first terminal of the second inductor is coupled to the first terminal of the first inductor. A first terminal of the third inductor receives a second signal, and a second terminal of the third inductor is coupled to a second terminal of the first inductor. A first terminal of the fourth inductor is coupled to the first terminal of the third inductor. The first capacitor is coupled between the first terminal of the first inductor and the first terminal of the third inductor. The second capacitor is coupled between a second terminal of the second inductor and a second terminal of the forth inductor.

The present invention provides a transformer structure including a metal wire, a first capacitor and a second capacitor. The metal wire includes a first coil to a fourth coil. The first coil to the fourth coil respectively forms a first inductor to a fourth inductor. A first terminal of the first coil receives a first signal. A first terminal of the second coil is coupled to the first terminal of the first coil. A first terminal of the third coil receives a second signal, and a second terminal of the third coil is coupled to a second terminal of the first coil. A first terminal of the fourth coil is coupled to the first terminal of the third coil. The first capacitor is coupled between the first terminal of the first coil and the first terminal of the third coil. The second capacitor is coupled between a second terminal of the second coil and a second terminal of the forth coil.

The present invention provides a transformer structure including a transmission line circuit, a first capacitor and a second capacitor. The transmission line circuit includes a first transmission line to a fourth transmission line. A first terminal of the first transmission line receives a first signal. A first terminal of the second transmission line is coupled to the first terminal of the first transmission line. A first terminal of the third transmission line receives a second signal, and a second terminal of the third transmission line is coupled to a second terminal of the first transmission line. A first terminal of the fourth transmission line is coupled to the first terminal of the third transmission line. The first capacitor is coupled between the first terminal of the first transmission line and the first terminal of the third transmission line. The second capacitor is coupled between a second terminal of the second transmission line and a second terminal of the forth transmission line.

The present invention provides a power amplifier applying the aforementioned transformer. The power amplifier includes a differential amplifier and a transformer. The differential amplifier can amplify differential signals and provide the amplified differential signals to the transformer.

In the present invention, four mutually coupled inductors and two capacitors forms the transformer. Therefore, energy dissipation of the conventional transformer technique applying two inductors for mutual inductance can be mitigated.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The conventional transformer technique applying two inductors for mutual inductance may have rather high energy dissipation. Accordingly, the embodiment of the invention provide a radio frequency transformer, in which four mutually coupled inductors and two capacitors are used to implement the transformer technique, so as to effectively improve an efficiency of the transformer and reduce the energy dissipation. In the following content, the transformer of a power amplifier is taken as an example for detailed description.

Figure 1:
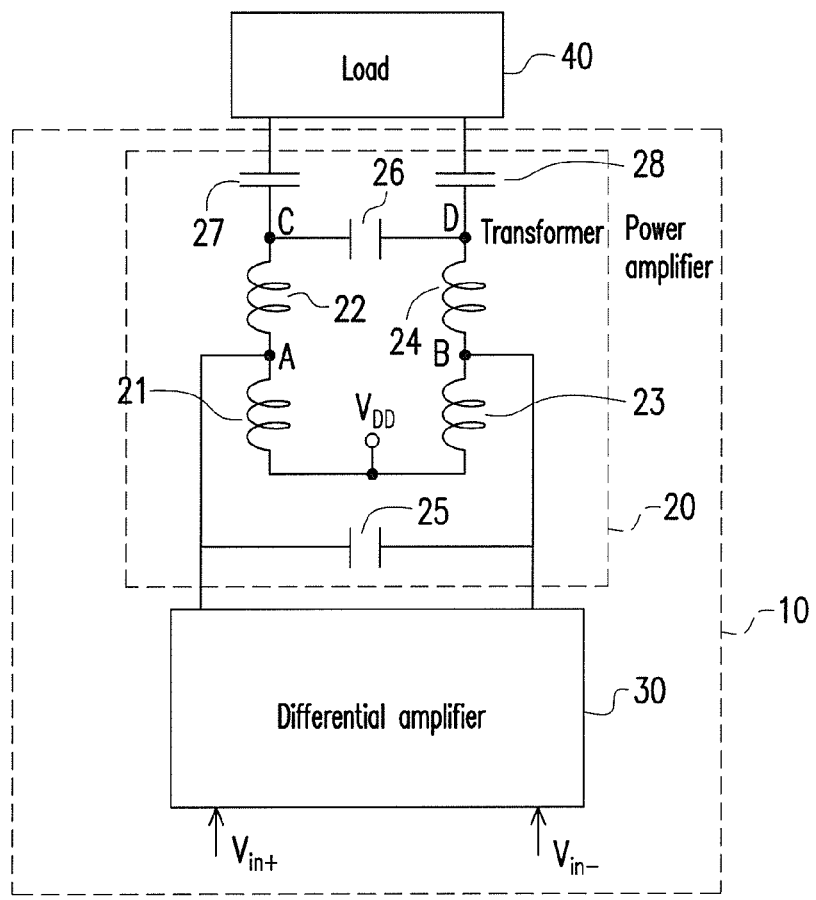
FIG. 1 is a circuit schematic diagram illustrating a power amplifier according to an embodiment of the present invention.
Figure 2:
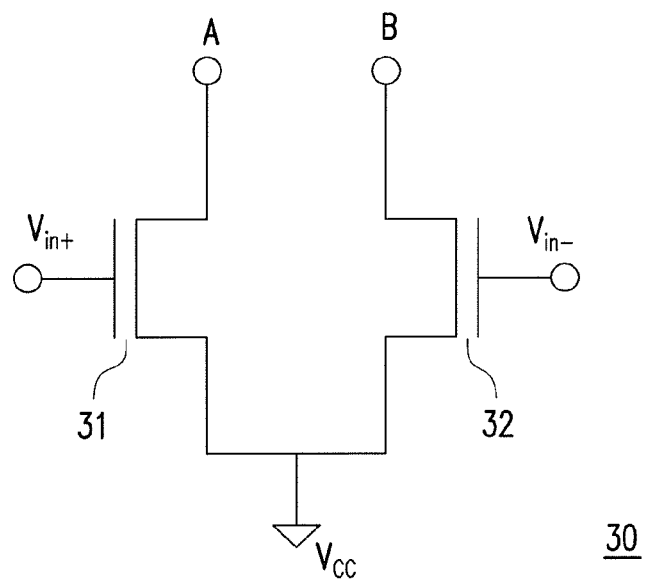
FIG. 2 is a circuit schematic diagram illustrating a differential amplifier according to an embodiment of the present invention.

FIG. 1 is a circuit schematic diagram illustrating a power amplifier according to an embodiment of the present invention. FIG. 2 is a circuit schematic diagram illustrating a differential amplifier according to an embodiment of the present invention. Referring to FIG. 1 and FIG. 2, in the present embodiment, the power amplifier 10 includes a transformer 20 and a differential amplifier 30. The differential amplifier 30 includes transistors 31 and 32. A first terminal and a second terminal of the transistor 31 are respectively coupled to a terminal A and a voltage $V_{CC}$, the voltage $V_{CC}$ is for example a ground voltage. For a radio frequency signal, the terminal coupled to the voltage $V_{CC}$ can be regarded as virtual ground. A first terminal and a second terminal of the transistor 32 are respectively coupled to a terminal B and the voltage $V_{CC}$, gates of the transistors 31 and 32 respectively receive signals $V_{in+}$ and $V_{in-}$ for amplifying the signals $V_{in+}$ and $V_{in-}$, and providing the signals to the transformer 20, wherein the signals $V_{in+}$ and $V_{in-}$ are differential signals. In the present embodiment, the transistors 31 and 32 are mutually matched. To be specific, the transistors 31 and 32 may have the same specification. Namely, the transistors 31 and 32 have the same size and symmetric circuit layout.

On the other hand, in the present embodiment, the transformer includes inductors 21-24 and capacitors 25 and 26. Moreover, the transformer 20 further includes capacitors 27 and 28. A first terminal and a second terminal of the inductor 21 are respectively coupled to the terminal A and a direct current (DC) bias $V_{DD}$, and the DC bias $V_{DD}$ is for example 5V. For the radio frequency signal, the terminal coupled to the DC bias $V_{DD}$ can be regarded as the virtual ground. A first terminal and a second terminal of the inductor 22 are respectively coupled to the terminal A and a terminal C. A first terminal and a second terminal of the inductor 23 are respectively coupled to the terminal B and the DC bias $V_{DD}$. A first terminal and a second terminal of the inductor 24 are respectively coupled to the terminal B and a terminal D. The capacitor 25 is coupled between the terminals A and B. The capacitor 26 is coupled between the terminals C and D. The capacitor 27 is coupled between the terminal C and a load 40. The capacitor 28 is coupled between the terminal D and the load 40. It should be noted that the inductors 21-24 can serve as transmission lines.

The transformer 20 can be for example, implemented on a semiconductor chip for coupling a system load via a bonding wire, and the system load is for example 50 ohms. The load 40 can be a load including parasitic inductance effect of the bonding wire. The transformer 20 can convert the differential signals provided by the differential amplifier 30 to the load 40 coupled to an output terminal.

In the present embodiment, the inductors 21-24 are for example spiral inductors implemented on the semiconductor chip. The inductors 21 and 23 are mutually matched. The inductors 22 and 24 are mutually matched. To be specific, the inductors 21 and 23 may have the same specification, and the inductors 22 and 24 may also have the same specification. Namely, the inductors 21 and 23 have the same size and symmetric circuit layout, and the inductors 22 and 24 also have the same size and symmetric circuit layout. Those skilled in the art can adjust an inductance ratio of the inductors 21 and 22, and an inductance ratio of the inductors 23 and 24 according to actual requirements, so as to change a transforming effect of the transformer 20. To be specific, number of the coils of the inductors 21 and 22 and number of the coils of the inductors 23 and 24 can be adjusted to change a peek ratio of an alternating current (AC) signal.

In the present embodiment, the capacitors 25 and 26 can be metal-insulator-metal (MIM) capacitors, and the capacitors 25 and 26 can serve as compensation capacitors. Those skilled in the art can adjust capacitances of the capacitors 25 and 26 according to actual requirements, so that the transformer 20 can coordinate with an operation frequency of the power amplifier 10 to achieve optimal impedance conversion efficiency.

In the present embodiment, the capacitors 27 and 28 can be the MIM capacitors, and the capacitors 27 and 28 are mutually matched. To be specific, the capacitors 27 and 28 may have the same specification. Namely, the capacitors 27 and 28 have the same size and symmetric circuit layout. The capacitors 27 and 28 can block an inflow load of the DC bias $V_{DD}$ fed by the transformer 20. Moreover, those skilled in the art can adjust the capacitances of the capacitors 27 and 28 according to actual requirements, so as to generate a serial resonance with the parasitic inductance of the load 40 under the operation frequency, so that the system load is equivalent to be directly connected to the terminals C and D for achieving a better impedance matching.

In the present embodiment, since the transformer 20 has a relatively high efficiency, the efficiency of the power amplifier is also increased. To clearly describe the transformer 20 for those skilled in the art, a structural diagram of the transformer 20 is provided below.

Figure 3:
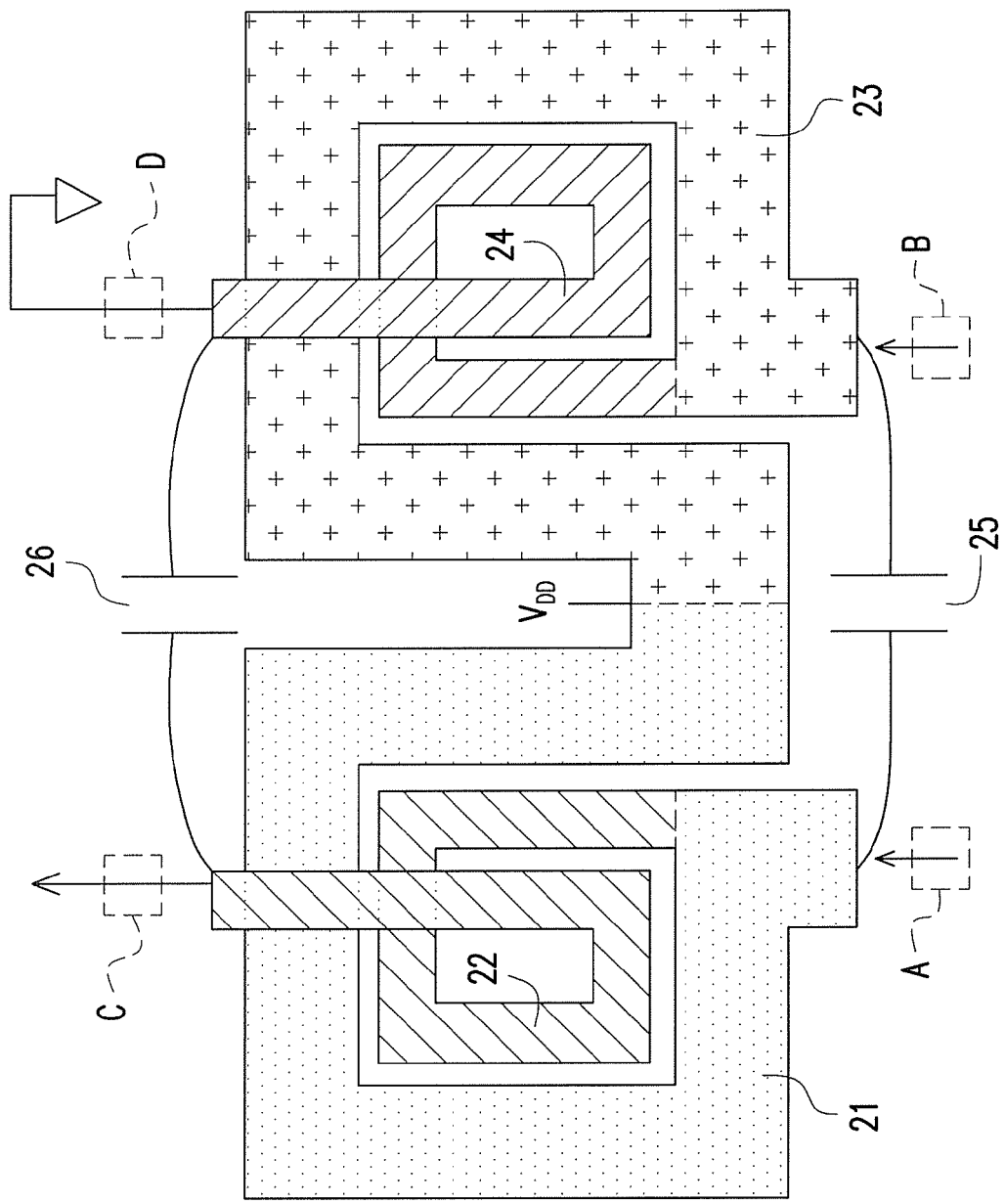
FIG. 3 is a structural diagram illustrating a transformer according to an embodiment of the present invention.

FIG. 3 is a structural diagram illustrating a transformer according to an embodiment of the present invention. Referring to FIG. 1 and FIG. 3, in the present embodiment, the inductors 21-24 are respectively formed by four coils of one single metal wire, wherein the coils forming the inductors 21 and 23 are mutually matched, and the coils forming the inductors 22 and 24 are mutually matched. It should be noted that the terminals C and D are respectively coupled to the capacitors 27 and 28 (not shown in FIG. 3). Since the capacitors 27 and 28 can block the DC signal, the DC signal cannot flow through the inductors 22 and 24. Namely, in the present embodiment, the AC signal can flow through the inductors 21-24, and the DC signal can flow through the inductors 21 and 23. Accordingly, in the present embodiment, a wire width of the inductor 21 can be designed greater than that of the inductor 22, and a wire width of the inductor 23 can be designed greater than that of the inductor 24. By such means, not only areas of the inductors 22 and 24 are reduced, but also resistive dissipation of the inductors 21 and 23 under a high DC current can be avoided.

It should be noted that the structural diagram of FIG. 3 can be effectively applied to all of metal layers, by which the thickness of metal wire can be increased to several skin depth so as to reduce a dissipation of the signal when the signal is transmitted on the metal wire. Therefore, the efficiency of the transformer 20 can also be effectively improved.

Though a possible pattern of the transformer and the structure and efficiency thereof is described in the aforementioned embodiment, those skilled in the art should understand that the transformers and the structures thereof, and the power amplifiers designed by various manufactures are different, so that application of the present invention is not limited to such possible pattern. In other words, as long as four mutually coupled inductor and two capacitors are used for forming the transformer, it is considered to be within the scope of the present invention. To further convey the spirit of the present invention to those skilled in the art, embodiments are further provided in the following content.

Referring to FIG. 1 again, in the aforementioned embodiment, though the transformer 20 includes the capacitors 27 and 28, the present invention is not limited thereto, and in other embodiments, in case filtering of the DC bias $V_{DD}$ is unnecessary, the transistors 27 and 28 can also be omitted.

Figure 4:
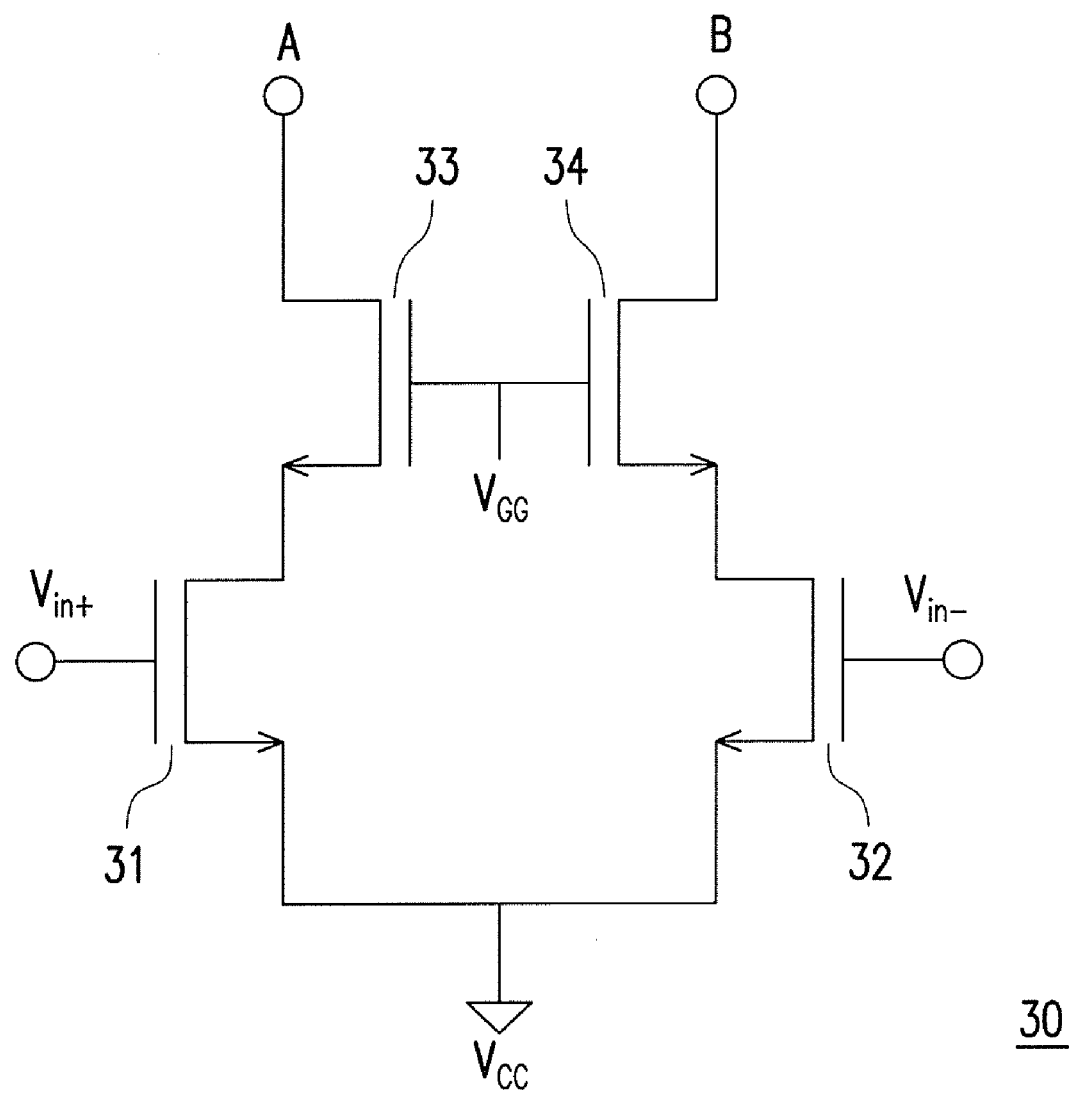
FIG. 4 is a circuit schematic diagram illustrating a differential amplifier according to another embodiment of the present invention.

Moreover, in the aforementioned embodiment, though the differential amplifier 30 of FIG. 1 is described based on the transistors 31 and 32 of FIG. 2, the present invention is not limited thereto, and implementation of the differential amplifier 30 can be changed by those skilled in the art according to an actual requirement. For example, FIG. 4 is a circuit diagram illustrating a differential amplifier according to another embodiment of the present invention. Referring to FIG. 1 and FIG. 4, in the present embodiment, the differential amplifier 30 of FIG. 4 includes transistors 31-34.

The transistors 33 and 34 are a common gate amplifier structure, and gates thereof are coupled to a voltage $V_{GG}$. The transistors 31 and 32 are a common source amplifier structure. The transistors 31-34 can form a two-stage differential amplifier, so that a maximum DC voltage that can be borne by the differential amplifier 30 can be improved. Moreover, in the present embodiment, though the common gate amplifier structure is only formed by the transistors 33 and 34, in other embodiments, the common gate amplifier structure can also be formed by a plurality of parallel-connected transistors, so as to improve an output power of the differential amplifier 30.

In summary, in the present invention, four mutually coupled inductors and two capacitors are used to form the transformer. Therefore, energy dissipation of the conventional transformer technique applying two inductors for mutual inductance can be mitigated. Moreover, in the embodiments of the present invention, by adjusting the inductance ratio of two sets of the inductors within the transformer, the impedance conversion ratio of the transformer can be changed. In addition, by adjusting the compensation capacitance of the transformer, the transformer can coordinate with the operation frequency of the power amplifier to achieve the optimal impedance conversion efficiency. Moreover, a DC block capacitor can be allocated at the output terminal of the transformer for blocking the DC bias. Further, by adjusting the capacitance of the DC block capacitor of the transformer, the external load and the transformer may have a better impedance matching. Moreover, the inductor without the DC signal flowing thereon can apply a metal wire with relatively small wire width, so as to reduce the area thereof. The inductor having the DC signal flowing thereon can apply the metal wire with relatively great wire width, so that the inductor can bear a relatively high direct current.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A transformer, comprising:
   a first inductor, having a first terminal receiving a first signal;
   a second inductor, having a first terminal directly connected to the first terminal of the first inductor;
   a third inductor, having a first terminal receiving a second signal, and a second terminal directly connected to a second terminal of the first inductor;
   a fourth inductor, having a first terminal directly connected to the first terminal of the third inductor;
   a first capacitor, directly connected between the first terminal of the first inductor and the first terminal of the third inductor; and
   a second capacitor, directly connected between a second terminal of the second inductor and a second terminal of the fourth inductor.

2. The transformer as claimed in claim 1 further, comprising:
   a third capacitor, coupled between the second terminal of the second inductor and a load; and
   a fourth capacitor, coupled between the second terminal of the fourth inductor and the load.

3. The transformer as claimed in claim 1, wherein wire width of the first inductor is greater than that of the second inductor, and wire width of the third inductor is greater than that of the fourth inductor.

4. The transformer as claimed in claim 1, wherein the first inductor and the third inductor are mutually matched, and the second inductor and the fourth inductor are mutually matched.

5. The transformer as claimed in claim 1, wherein the first capacitor and the second capacitor are metal-insulator-metal (MIM) capacitors.

6. The transformer as claimed in claim 1, wherein the first signal and the second signal are differential signals.

7. The transformer as claimed in claim 1, wherein the second terminal of the first inductor and the second terminal of the third inductor are coupled to a direct current (DC) bias.

8. A transformer structure, comprising:
   a metal wire, comprising:
     a first coil, forming a first inductor, wherein a first terminal of the first coil receives a first signal;
     a second coil, forming a second inductor, wherein a first terminal of the second coil is directly connected to the first terminal of the first coil;
     a third coil, forming a third inductor, wherein a first terminal of the third coil receives a second signal, and a second terminal of the third coil is directly connected to a second terminal of the first coil; and
     a fourth coil, forming a fourth inductor, wherein a first terminal of the fourth coil is directly connected to the first terminal of the third coil; and
     a first capacitor, directly connected between the first terminal of the first coil and the first terminal of the third coil; and
     a second capacitor, directly connected between a second terminal of the second coil and a second terminal of the fourth coil.

9. The transformer structure as claimed in claim 8 further comprising:
   a third capacitor, coupled between the second terminal of the second coil and a load; and
   a fourth capacitor, coupled between the second terminal of the fourth coil and the load.

10. The transformer structure as claimed in claim 8, wherein wire width of the first coil is greater than that of the second coil, and wire width of the third coil is greater than that of the fourth coil.

11. The transformer structure as claimed in claim 8, wherein the first coil and the third coil are mutually matched, and the second coil and the fourth coil are mutually matched.

12. The transformer structure as claimed in claim 8, wherein the first capacitor and the second capacitor are MIM capacitors.

13. The transformer structure as claimed in claim 8, wherein the first signal and the second signal are differential signals.

14. The transformer structure as claimed in claim 8, wherein the second terminal of the first coil and the second terminal of the third coil are coupled to a DC bias.

15. A transformer structure, comprising:
a transmission line circuit, comprising:
a first transmission line, having a first terminal receiving a first signal;
a second transmission line, having a first terminal directly connected to the first terminal of the first transmission line;
a third transmission line, having a first terminal receiving a second signal, and a second terminal directly connected to a second terminal of the first transmission line; and
a fourth transmission line, having a first terminal directly connected to the first terminal of the third transmission line; and
a first capacitor, directly connected between the first terminal of the first transmission line and the first terminal of the third transmission line; and
a second capacitor, directly connected between a second terminal of the second transmission line and a second terminal of the fourth transmission line.

16. The transformer structure as claimed in claim 15 further comprising:
a third capacitor, coupled between the second terminal of the second transmission line and a load; and
a fourth capacitor, coupled between the second terminal of the fourth transmission line and the load.

17. The transformer structure as claimed in claim 15, wherein the first transmission line and the third transmission line are mutually matched, and the second transmission line and the fourth transmission line are mutually matched.

18. The transformer structure as claimed in claim 15, wherein the first signal and the second signal are differential signals.

19. The transformer structure as claimed in claim 15, wherein the second terminal of the first transmission line and the second terminal of the third transmission line are coupled to a DC bias.

20. A power amplifier, comprising:
a differential amplifier, for receiving a first signal and a second signal to generate a third signal and a fourth signal; and
a transformer, directly connected to the differential amplifier, and the transformer comprising:
a first inductor, having a first terminal receiving the third signal;
a second inductor, having a first terminal directly connected to the first terminal of the first inductor;
a third inductor, having a first terminal receiving the fourth signal, and a second terminal directly connected to a second terminal of the first inductor;
a fourth inductor, having a first terminal directly connected to the first terminal of the third inductor;
a first capacitor, directly connected between the first terminal of the first inductor and the first terminal of the third inductor; and
a second capacitor, directly connected between a second terminal of the second inductor and a second terminal of the fourth inductor.

21. The power amplifier as claimed in claim 20, wherein the differential amplifier further comprises:
a first transistor, having a first terminal and a second terminal respectively coupled to a voltage and the first terminal of the first inductor, and a gate receiving the first signal; and
a second transistor, having a first terminal and a second terminal respectively coupled to the voltage and the first terminal of the third inductor, and a gate receiving the second signal.

22. The power amplifier as claimed in claim 20, wherein the differential amplifier further comprises:
a first transistor, having a first terminal coupled to a first voltage, and a gate receiving the first signal;
a second transistor, having a first terminal coupled to the first voltage, and a gate receiving the second signal;
a third transistor, having a first terminal and a gate respectively coupled to a second terminal of the first transistor and a second voltage, and a second terminal coupled to the first terminal of the first inductor for providing the third signal; and
a fourth transistor, having a first terminal and a gate respectively coupled to a second terminal of the second transistor and the second voltage, and a second terminal coupled to the first terminal of the third inductor for providing the fourth signal.

23. The power amplifier as claimed in claim 20, wherein the transformer further comprises:
a third capacitor, coupled between the second terminal of the second inductor and a load; and
a fourth capacitor, coupled between the second terminal of the fourth inductor and the load.

24. The power amplifier as claimed in claim 20, wherein wire width of the first inductor is greater than that of the second inductor, and wire width of the third inductor is greater than that of the fourth inductor.

25. The power amplifier as claimed in claim 20, wherein the first inductor and the third inductor are mutually matched, and the second inductor and the fourth inductor are mutually matched.

26. The power amplifier as claimed in claim 20, wherein the first capacitor and the second capacitor are MIM capacitors.

27. The power amplifier as claimed in claim 20, wherein the third signal and the fourth signal are differential signals.

28. The power amplifier as claimed in claim 20, wherein the second terminal of the first inductor and the second terminal of the third inductor are coupled to a DC bias.

* * * * *